United States Patent [19]

Jeon et al.

[11] Patent Number: 5,796,804
[45] Date of Patent: Aug. 18, 1998

[54] X-RAY MASK STRUCTURE FOR REDUCING THE DISTORTION OF A MASK

[75] Inventors: Young Jin Jeon; Sang Soo Choi; Hai Bin Chung; Jong Hyun Lee; Hyung Joun Yoo, all of Taejon-shi, Rep. of Korea

[73] Assignee: Electronics and Telecommunications Research Institute, Daejeon, Rep. of Korea

[21] Appl. No.: 794,906

[22] Filed: Feb. 4, 1997

[30] Foreign Application Priority Data

May 25, 1996 [KR] Rep. of Korea ............. 96-17848

[51] Int. Cl.⁶ .................................................. G21K 5/08
[52] U.S. Cl. .......................................... 378/35; 378/34
[58] Field of Search .................................. 378/34, 35

[56] References Cited

U.S. PATENT DOCUMENTS 5,224,139  6/1993  Korenaga et al. ............. 378/35 X
5,356,686  10/1994 Fujioka et al.
5,485,495  1/1996  Miyachi et al. ............... 378/35 X

FOREIGN PATENT DOCUMENTS 3-235321  10/1991  Japan ............................ 378/35
6-120124  4/1994   Japan ............................ 378/35

Primary Examiner—David P. Porta
Attorney, Agent, or Firm—Antonelli, Terry, Stout & Kraus, LLP

[57] ABSTRACT

A X-ray mask structure which reduces the distortion of the membrane, the X-ray mask structure including, a mask substrate having an opening in the central part thereof, a membrane formed on the mask substrate, the membrane having the chip site on which absorbers are arranged according to a desired pattern of a semiconductor device, and a support ring for supporting the mask substrate, which is defined by a plurality of fragments.

2 Claims, 7 Drawing Sheets

X-RAY MASK STRUCTURE FOR REDUCING THE DISTORTION OF A MASK

BACKGROUND OF INVENTION

Field of the invention

The present invention relates to an X-ray mask structure, more particularly, to an X-ray mask structure which reduces the distortion of an X-ray mask.

Nowadays the X-ray lithography process, rather than any other lithography process, such as optical lithography, is increasingly used in manufacturing a semiconductor device because the micro pattern of the semiconductor device can be easily formed through the X-ray lithography process.

When the X-ray lithography process is used, the distortion of the X-ray mask is critical. Since absorbers are located on a membrane and the pattern of the semiconductor is formed according to the arrangement of the absorbers, the distortion of the membrane is particularly critical. If the distortion of the membrane occurs, it will affect the pattern of the semiconductor device and may result in a failure to form a desired pattern.

Accordingly, it is desirable to develop an X-ray mask structure which can reduce the distortion of the membrane.

SUMMARY OF THE INVENTION

The present invention is directed to an X-ray mask structure that satisfies this desire. An X-ray mask structure having features of the invention comprises a mask substrate, a membrane formed on the mask substrate, and a support ring for supporting the mask substrate. The mask substrate has an opening in the central part thereof and absorbers which absorb X-ray are arranged on the membrane in accordance with a desired pattern of the semiconductor device. It should be appreciated that the support ring comprises a plurality of fragments. It decreases the bonding area between the support ring and the mask substrate and reduces the distortion of the membrane. Also, it is possible to form a plurality of projections on the support ring so as to decrease the bonding area.

BRIEF DESCRIPTION OF THE DRAWINGS

These and other features, aspects, and advantages of the present invention will become better understood with regard to the following description, appended claims, and accompanying drawings where:

DETAILED DESCRIPTION OF THE INVENTION

Figure 1:
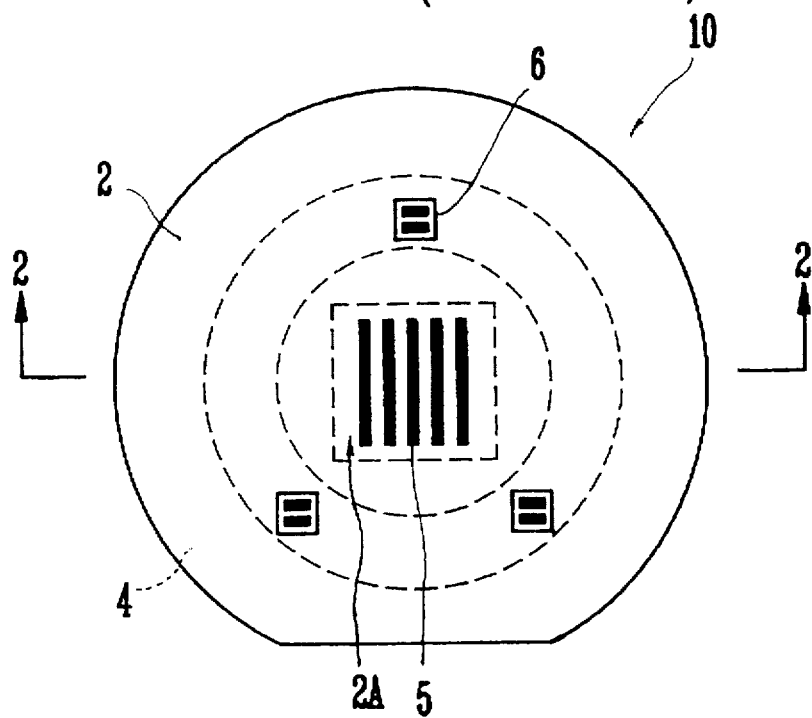
FIG. 1 is a plane view showing a general X-ray mask structure used in a conventional X-ray lithography process.
Figure 2:
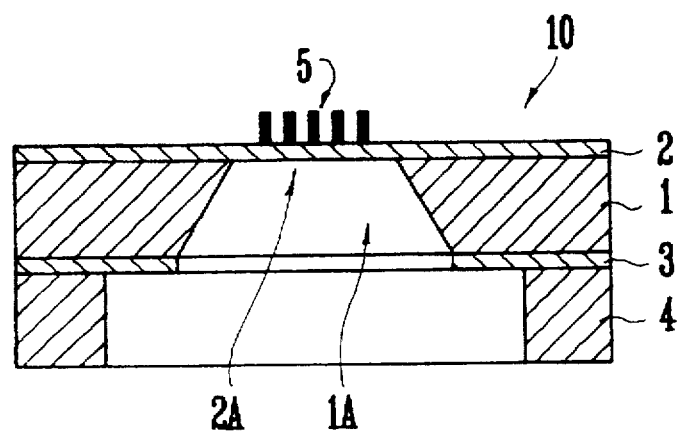
FIG. 2 is a sectional view taken along line 2—2 in FIG. 1.

FIG. 1 shows a general X-ray mask 10 used in a conventional X-ray lithography process and FIG. 2 is a sectional view taken along line 2—2 in FIG. 1. As shown, the general X-ray mask 10 has a mask substrate 1, a membrane 2, and a support ring 4. The mask substrate 1 has an opening 1A in the central part thereof. In the membrane 2, the portion 2A corresponding to the opening 1A is a chip site and absorbers 5 are arranged thereon. The supporting ring 4 supports the mask substrate 1. The numerals 3 and 6 designate a lower membrane formed below the mask substrate 1 and an alignment window, respectively. Since the absorbers 5 are arranged on the portion 2A according to a desired pattern of a semiconductor device, when the X-ray is transmitted to the X-ray mask 10, the desired pattern will be formed on a wafer (not shown) loaded below the X-ray mask 10.

Figure 3:
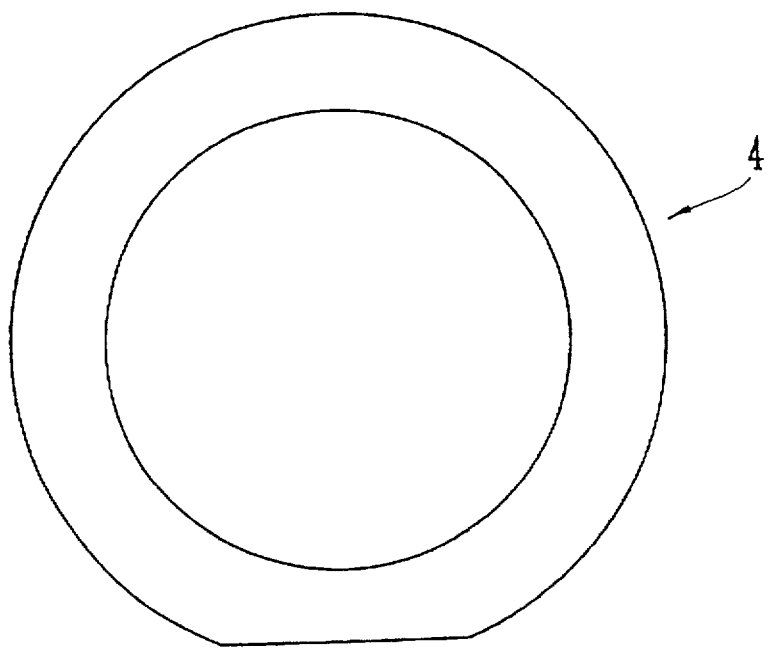
FIG. 3 is a plane view showing the conventional support ring.

FIG. 3 is a plane view of the conventional support ring. As shown, the support ring is defined as one body. In contrast with this conventional support ring, a support ring according to the present invention is defined as a plurality of fragments. Alternatively, a support ring according to another version of the present invention is defined by the support ring which has a plurality of projections formed thereon. These support rings according to the present invention decrease the bonding area between the mask substrate and the support ring and contribute to reduce the distortion of the membrane 2, as will be explained by simulation data (refer to FIGS. 7A and 7B).

Figure 4A:
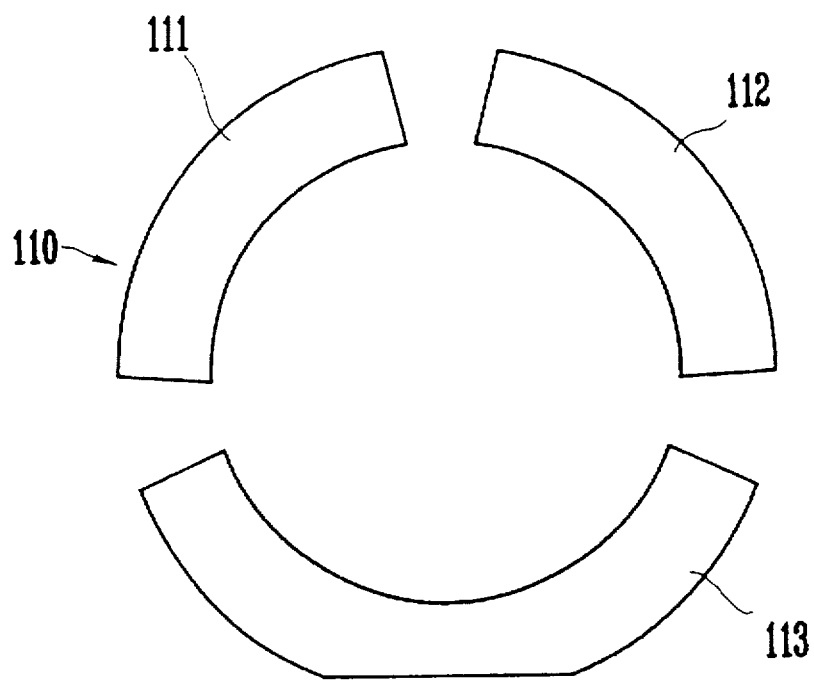
FIG. 4A is a plane view of a support ring embodying features of the present invention for reducing the distortion of the membrane.
Figure 4B:
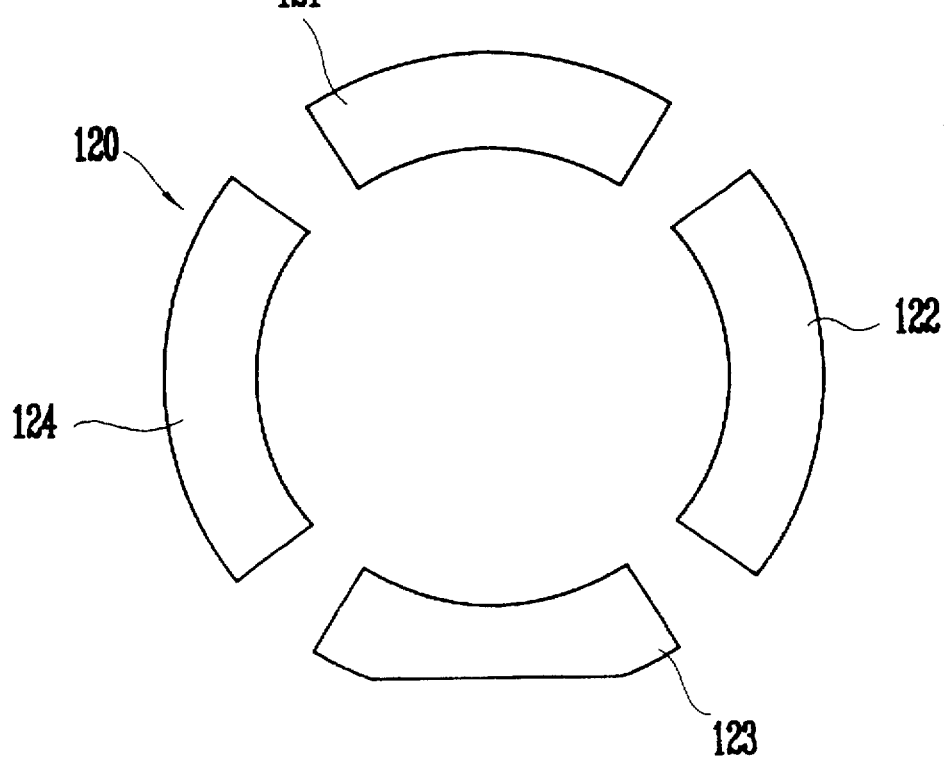
FIG. 4B is a plane view of another version of a support ring embodying features of the present invention for reducing a distortion of the membrane.
Figure 4C:
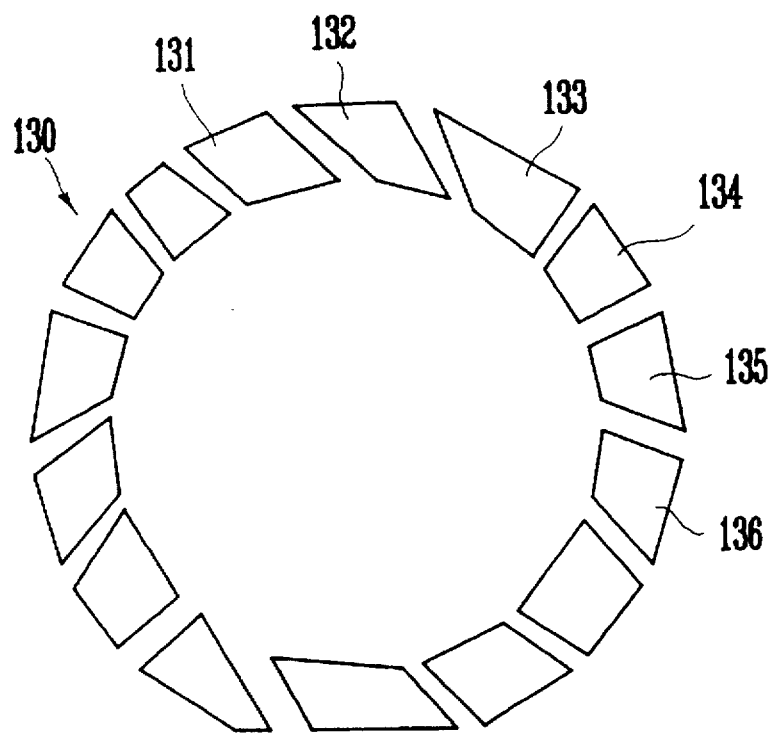
FIG. 4C is a plane view of another version of a support ring embodying features of the present invention for reducing the distortion of the membrane.
Figure 4D:
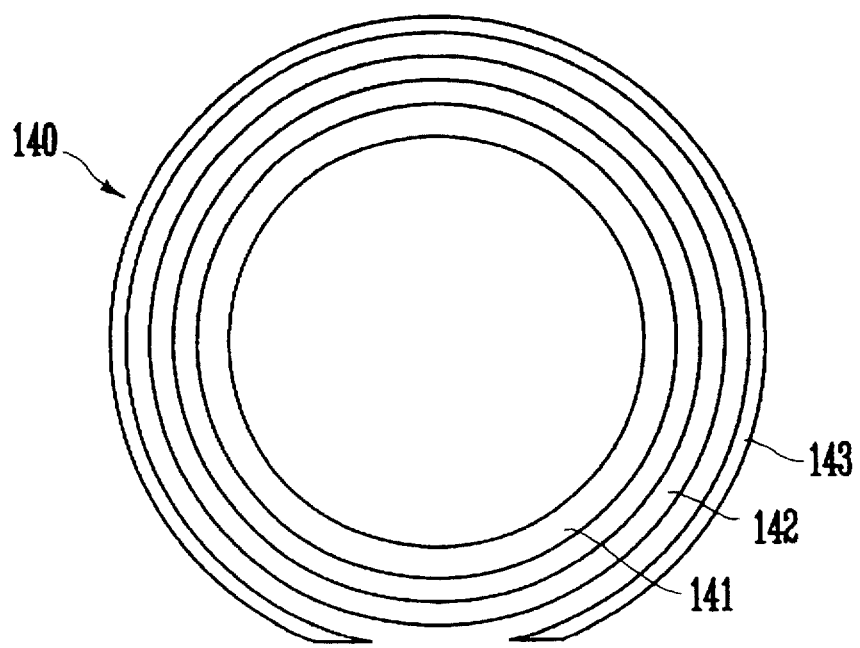
FIG. 4D is a plane view of another version of a support ring embodying features of the present invention for reducing the distortion of the membrane.

FIGS. 4A to 5C show plane views of the support ring embodying features of the present invention for reducing the distortion of the membrane. First, FIG. 4A shows the support ring 110 defined by three pieces of glass 111, 112, and 113. FIG. 4B shows the support ring 120 defined by four pieces of glass 121, 122, 123 and 124. FIG. 4C shows the support ring 130 defined by more than four pieces of glass such as 131, 132, 133, 134, 135 and 136. The number of the fragments defining the support ring is not limited to those illustrated in these embodiments. FIG. 4D illustrates another support ring 140 defined by a plurality of concentric circular glass such as 141, 142 and 143.

Figure 5A:
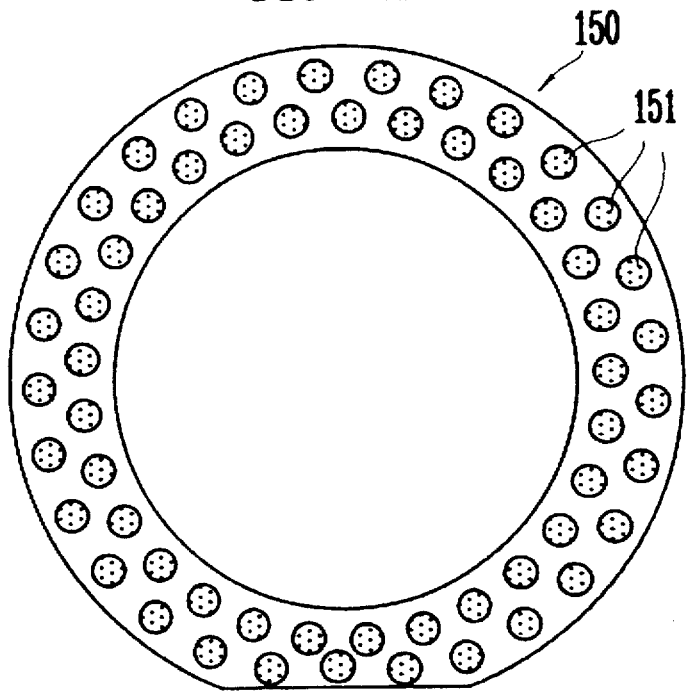
FIG. 5A is a plane view of another version of a support ring embodying features of the present invention for reducing the distortion of the membrane.
Figure 5B:
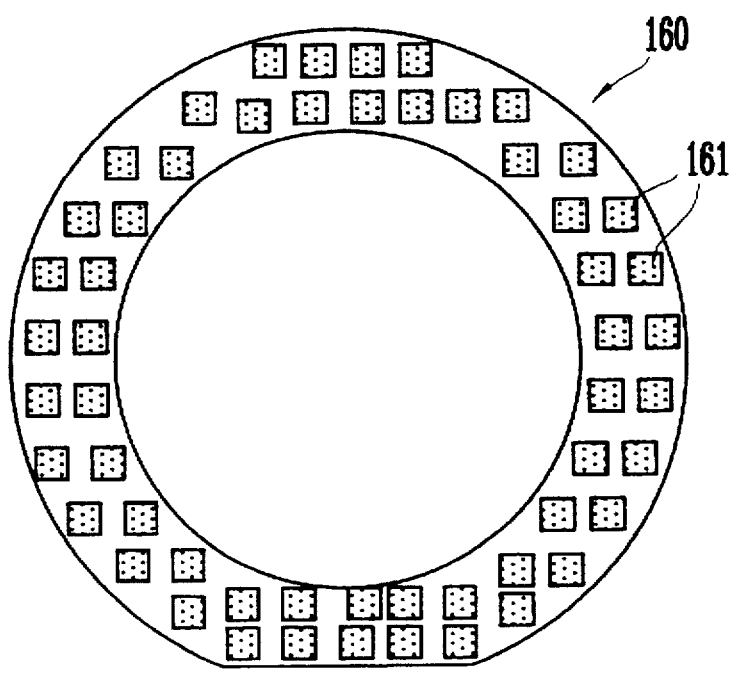
FIG. 5B is a plane view of another version of a support ring embodying features of the present invention for reducing the distortion of the membrane.
Figure 5C:
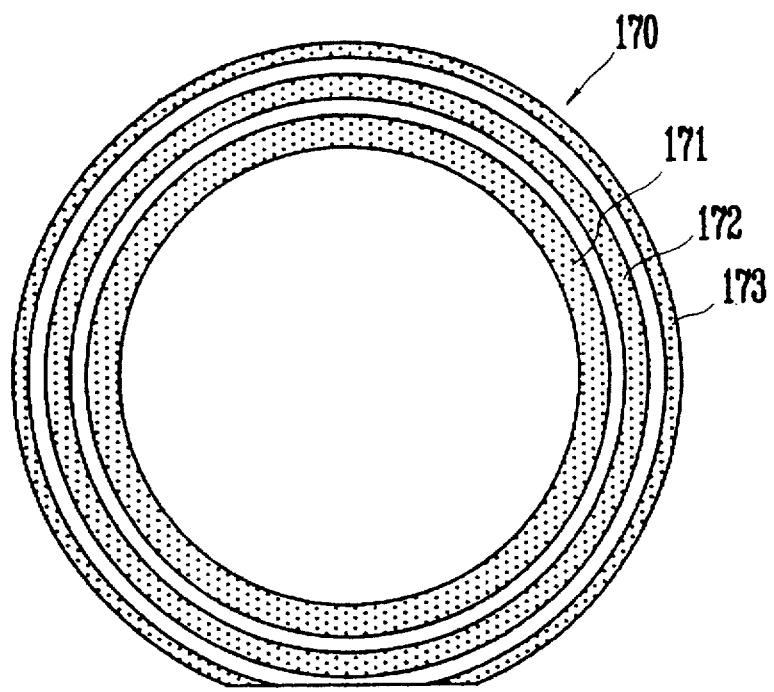
FIG. 5C is a plane view of another version of a support ring embodying features of the present invention for reducing the distortion of the membrane.

FIGS. 5A to 5C represent other embodiments characterized by a plurality of projections formed on the support ring. In FIG. 5A, the circular projections 151 are formed on the support ring 150. Preferably, the diameter of the projection may be 3 to 5 mm. In FIG. 5B, the square projections 161 are formed on the support ring 160. Preferably, the side length of the square projection may be 3 to 5 mm. FIG. 5C shows the support ring 170 in which the projections on the support ring are defined by a plurality of concentric circular rings. The circular ring projections 171, 172 and 173 formed on the support ring 170 are shown in FIG. 5C. The preferred height of the projections is approximately 1 to 5 μmm.

Figure 6:
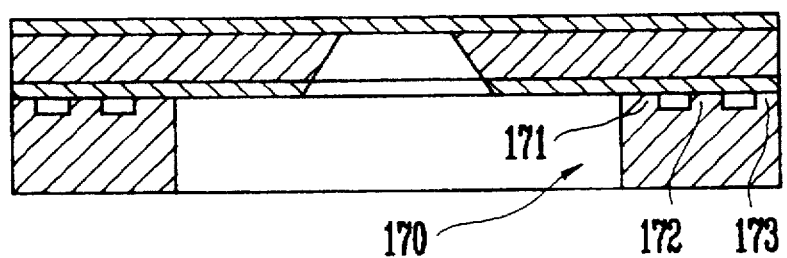
FIG. 6 is a sectional view of one embodiment of the X-ray mask structure according to the present invention.

FIG. 6 is a sectional view of one embodiment of the X-ray mask structure according to the present invention. Numerals 171, 172 and 173 designate the projections, and when compared with FIG. 2, it will be found that the bonding area is decreased.

Figure 7A:
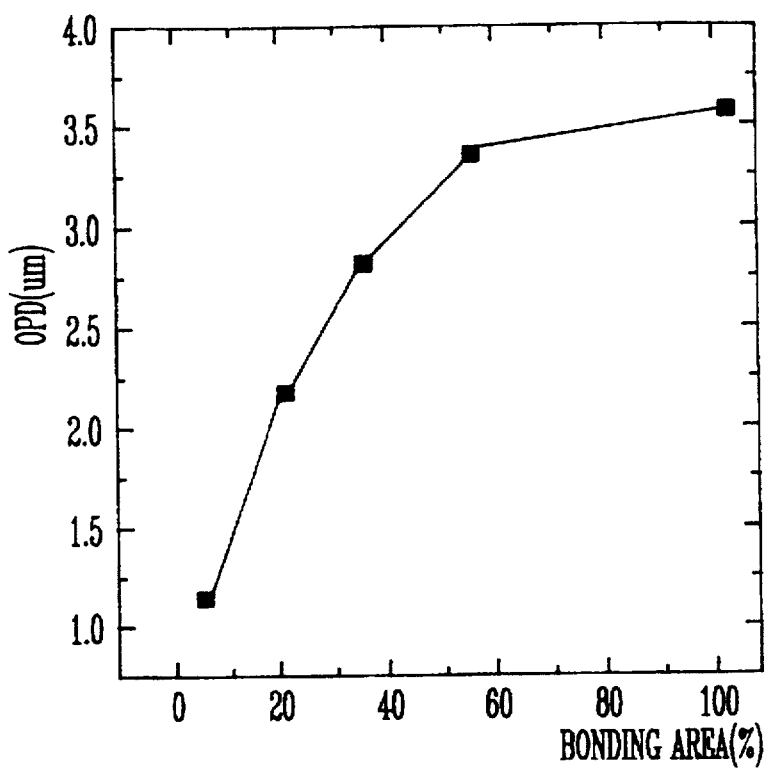
FIG. 7A is a graph showing Out of plane Distortion (OPD) of the membrane as the bonding area changes between a support ring and a mask substrate.
Figure 7B:
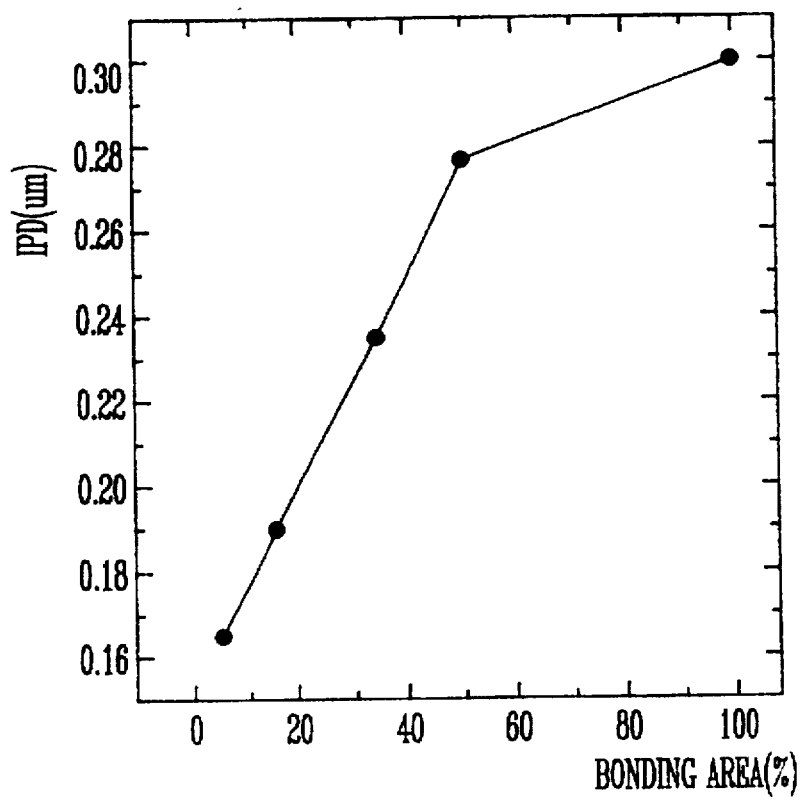
FIG. 7B is a graph showing In-Plane Distortion (IPD) of the membrane as the bonding area changes between a support ring and a mask substrate.

The simulation data related to the present invention are represented in FIGS. 7A and 7B. FIG. 7A is a graph showing Out of Plane Distortion (OPD) of the membrane as the bonding area changes between the support ring and the mask substrate. FIG. 7B is a graph showing In-Plane Distortion (IPD) of the membrane as the bonding area changes between the support ring and the mask substrate. The initial condition of this simulation is as follows:

|  | X-ray mask | | | | | | | |
|---|---|---|---|---|---|---|---|---|
|  | thickness | external diameter | internal diameter | width | area | material | residual stress | coefficient of thermal expansion |
| mask substrate | 625 μmm | 100 mm |  |  |  |  |  | $2.6 \times 10^{-6}/°C.$ |
| upper and lower membrane | 2 μmm |  |  |  |  | SiN | 200 Mpa | $2.7 \times 10^{-6}/°C.$ |
| chip site on the upper membrane |  |  |  |  | $16 \times 16$ mm$^2$ |  |  |  |
| support ring | 5 mm | 100 mm | 80 mm | 10 mm |  |  |  | $3.6 \times 10^{-6}/°C.$ |

Also, the simulation was performed in conditions where the mask substrate and the support ring are heated to 300° C. and the support ring is then attached to the mask substrate by means of anodic bonding, and then the mask substrate and the support ring are gradually cooled to room temperature (25° C.).

As shown in FIGS. 7A and 7B, the distortion of the membrane is reduced as the bonding area is decreased. Specifically, OPD value is reduced from 3.5 μm to 1.2 μm when the bonding area is reduced from 100% to 5%. Further, IPD value is reduced from 0.3 μm to 0.17 μm when the bonding area is reduced from 100% to 5%.

As described above, by the present invention, it is possible to provide a X-ray mask structure which reduces the distortion of the X-ray mask, particularly, the distortion of the membrane and, as a result, better maintains the flatness of the membrane. Consequently, through the present invention, the desired pattern can be better obtained in the semiconductor device manufacturing process.

The foregoing description, although described in its preferred embodiments with a certain degree of particularity, is only illustrative of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. An X-ray mask structures, comprising:

a mask substrate having an opening in a central part thereof;

a membrane formed on the mask substrate, the membrane having a chip site on which absorbers are arranged according to a desired pattern of a semiconductor device; and a support ring for supporting the mask substrate, which is defined by a plurality of fragments.

2. A X-ray mask structure as set forth in claim 1, in which the fragments comprise a plurality of concentric circular glass.

* * * * *